United States Patent [19]

Oppelt

[11] Patent Number: 5,724,312

[45] Date of Patent: Mar. 3, 1998

[54] ULTRASOUND TRANSDUCER HEAD WITH INTEGRATED VARIABLE-GAIN AMPLIFIER DEVICES

[75] Inventor: Ralph Oppelt, Uttenreuth, Germany

[73] Assignee: Siemens Aktiengesellschaft, Munich, Germany

[21] Appl. No.: 632,815

[22] Filed: Apr. 17, 1996

[30] Foreign Application Priority Data

Apr. 18, 1995 [DE] Germany ............... 195 14 308.6

[51] Int. Cl.[6] .................................................. G01S 7/526
[52] U.S. Cl. ............................................................. 367/98
[58] Field of Search .................................. 367/98, 7, 135;
  73/631; 128/660.06, 660.01

[56] References Cited

U.S. PATENT DOCUMENTS

| 3,757,288 | 9/1973 | Morin ............................ 367/135 |
| 3,851,301 | 11/1974 | Demers et al. .................... 367/94 |
| 3,975,704 | 8/1976 | Klein ............................... 367/98 |
| 4,140,107 | 2/1979 | Lancee et al. ...................... 73/626 |
| 4,237,399 | 12/1980 | Sakamoto ........................ 310/317 |
| 4,445,379 | 5/1984 | Yamaguchi et al. ............... 73/631 |
| 4,489,729 | 12/1984 | Sorenson ....................... 128/661.01 |
| 4,563,899 | 1/1986 | Nakamura ...................... 128/661.09 |
| 4,805,458 | 2/1989 | Yoshie ............................. 73/602 |
| 4,835,747 | 5/1989 | Billet ............................. 367/164 |
| 4,926,380 | 5/1990 | Harada ............................ 367/7 |

FOREIGN PATENT DOCUMENTS

| 0 235 837 | 9/1987 | European Pat. Off. . |
| 0 287 443 | 10/1988 | European Pat. Off. . |
| 0 600 654 | 6/1994 | European Pat. Off. . |
| 0 600 654 A1 | 6/1994 | European Pat. Off. . |
| 29 42 641 | 4/1981 | Germany . |
| 43 18 531 | 1/1995 | Germany . |
| 1 587 106 | 4/1981 | United Kingdom . |
| 2114296 | 8/1983 | United Kingdom . |

OTHER PUBLICATIONS

D. Self, Advanced Preamplifier Additions, Wireless World, Oct. 1977, pp. 75–77.
Application Note 200–1, Designer's Guide For 200 Series Op Amps, Conlinear Corp., Nov. 1984).
U. Tietze et al., "Halbleiter–Schaltungstechnik", 9th Ed. 1990, p. 350.

*Primary Examiner*—Daniel T. Pihulic
*Attorney, Agent, or Firm*—Kenyon & Kenyon

[57] ABSTRACT

An ultrasound transducer head that contains at least one transducer element, which receives ultrasound signals and converts them into electrical receive signals, and an amplifier device, which electrically amplifies the receive signals of the transducer element. The amplifier device contains at least one capacitive component, preferably a controllable capacitive diode. The gain of the amplifier device can be varied as a function of the capacitance of the capacitive component. A virtually loss-free gain is obtained over a large dynamic response range.

16 Claims, 8 Drawing Sheets

5,724,312

ULTRASOUND TRANSDUCER HEAD WITH INTEGRATED VARIABLE-GAIN AMPLIFIER DEVICES

FIELD OF THE INVENTION

The present invention relates to an ultrasound transducer head and an ultrasound device with such a transducer head.

BACKGROUND INFORMATION

Ultrasound devices are known for ultrasound imaging of objects using the pulse-receiving method, used mainly in medicine for imaging tissues and in non-destructive materials testing. In such prior art ultrasound devices a transducer head (applicator) is guided over the object to be imaged. The transducer head contains at least one piezoelectric transducer element, and generally contains a plurality of transducer elements forming a linear or two-dimensional array. In the transit mode of the ultrasound device, the transducer elements in the transducer heads are excited with electric pulses in a transmitter unit to vibrate at a high frequency and to produce an ultrasound pulse directed at the object. This ultrasound pulse is reflected in the object, for example, on the boundary surfaces between two media with different acoustic impedances. In the receiving mode of the system, the ultrasound receiving pulses reflected back to the transducer head are converted by the transducer elements into the corresponding electrical receiving signals. These electrical receiving signals are transferred to a mainframe by the transducer head through an appropriate signal cable. The transferred electrical receiving signals of each transducer element are amplified in the mainframe by a pre-amplifier assigned to this transducer element. The amplified electrical receiving signals are sent to a signal processor in the mainframe for analysis of the information about the imaged object.

One problem with such ultrasound devices is the high dynamic response of the electrical receiving signals during the receive operation. At the beginning of the receive operation, the signal amplitudes of the received receiving pulses are still comparatively high, but they progressively diminish due to attenuation within the object as the receive operation continues. In order to compensate for the weakening of the signals due to attenuation in the object, variable-gain amplifiers with time-dependent controlled gain (time-gain compensation amplifiers, or "TGC amplifiers") are generally provided in the mainframe.

Impedance differences between the relatively high-resistance transducer elements and the low-resistance signal cables, and the resulting load on the transducer elements used as signal sources represent another problem. U.S. Pat. No. 4,489,729 describes a process for integrating a linear fixed-gain pre-amplifier within the transducer head of each transducer element for better impedance matching. The linear pre-amplifier described therein contains an operational amplifier, the output of which is connected to an input through a parallel low-pass filter circuit comprising a fixed resistor and two capacitors connected in series. If the constant gain of such a pre-amplifier is set low, the signal-to-noise ratio for weak receive signals is also low. In contrast, high receiving signal amplitudes can be distorted when the constant gain of the preamplifier is high. Therefore, when a fixed-gain preamplifier is used, the dynamic response range of the ultrasound device is relatively small.

European Pat. No. A-0 600 654 describes an ultrasound device for imaging an object, wherein a variable-gain amplifier, in addition to a constant-gain pre-amplifier, is assigned to each transducer element in the transducer head. The fixed-gain pre-amplifier is electrically connected between the transducer element and the variable-gain amplifier. The output of the variable-gain amplifier is configured as an impedance transducer with a push-pull emitter-follower and is connected electrically with the corresponding signal cable, which transfers the amplified receiving signals to a mainframe. The input impedance of the pre-amplifier is matched to the high impedance of the transducer element, while the output impedance of the push-pull emitter-follower is matched to the low impedance of the signal cable. The amplified receiving signals are used in the mainframe for producing an image of the object. The variable-gain amplifier is driven by the mainframe via additional conductors in the signal cable with control signals, known as TGC control signals, for controlling the gain of the variable-gain amplifier in order to compensate time-dependent attenuations. Therefore, in such an ultrasound device, the TGC amplifiers are integrated in the transducer head.

The variable-gain amplifiers in the transducer head described in European Pat. No. A-0 600 654 operate by the principle of a steepness multiplicator, as described in Tietze, Schenk: "Halbleiterschaltungstechnik" (Semiconductor Circuit Technology), 9th edition, 1990, Springer Verlag, p. 350. The bias current of the entire circuit must be of such an intensity that even the ultrasound receive signal with the highest amplitude is transmitted without distortion. Therefore, the variable-gain amplifier in the ultrasound device described in European Pat. A-0 600 654 has a relatively high power loss.

A variable-gain operational amplifier where a field-effect transistor (FET) controlled by a continuously or digitally controlled voltage source is connected into a negative feedback circuit for the operational amplifier is known. A feedback circuit with another operational amplifier for linearization of the FET's electrical resistance is also provided where the FET is used as a variable resistor. The FET can also be connected to a negative feedback circuit to increase its dynamic response range ("Application Note 200-1, Designer's Guide for 200 Series Op Amps" by Comlinear Corporation, November, 1984). While FETs used as variable resistors need no control power, they have relatively high tolerances in their characteristic curves.

For two-dimensional arrays of ultrasound transducer elements, a large number (typically 5000) of pre-amplifiers must be integrated in the transducer head in an obviously smaller volume than that required by one-dimensional arrays. The power consumption of the pre-amplifiers must therefore be clearly less than that of one-dimensional arrays, in order to avoid overheating. For the same reason, the power loss of the integrated amplifier also represents a problem in the ultrasound transducer head described in the aforementioned European Pat. No. A-0 600 654.

SUMMARY OF THE INVENTION

An object of the present invention is to provide an ultrasound transducer head with at least one transducer element and a variable-gain amplifier device for each transducer element, as well as an ultrasound device with such a transducer head, wherein the gain of each amplifier device is variable and the power loss of each amplifier device is kept low. In a one-dimensional or two-dimensional array of transducer elements in the transducer head, each amplifier device assigned to each transducer element should also exhibit good synchronism characteristics.

The present invention is based on the principle of controlling the gain of the amplifier devices by controlling a capacitor. Such a capacitive control has a virtually negligible current consumption. The amplifier device according to the present invention contains at least one capacitive component, which determines the gain of the amplifier device and whose capacitance is variable.

The advantages of the present invention can be seen in the various preferred embodiments of the ultrasound transducer head and the ultrasound device described herein. In one embodiment, a controllable capacitive diode is preferably used as a controllable capacitive component. Controllable capacitive diodes can be controlled virtually without power loss using a control voltage applied in the reverse direction and have precisely reproducible characteristic curves. In another embodiment, the at least one capacitive component is connected into a negative feedback circuit for at least one amplifier.

Another advantageous embodiment of the present invention is based on the principle of feeding the electrical receiving signal of the transducer element in the amplifier device to two consecutive transmitters with transfer functions having different frequency dependencies and selecting or adjusting the two transfer functions so that their frequency dependencies basically compensate one another in a given frequency range of the receiving signals and the amplitude of the amplified output signal of the amplifier device has a basically frequency-independent gain in relation to the amplitude of the input signal. The gain for the electrical receiving signal is then controlled by changing the frequency-dependence of both transfer functions in the given frequency range. On the basis of this principle, the amplifier device in this embodiment contains two electric transfer elements, each with a frequency-dependent transfer function. The transfer function is defined as the ratio between the amplitude of the output signal to the amplitude of the input signal of the respective transfer element. The two transfer elements are connected in series between an input of the amplifier device where the electrical receiving signal to be amplified is applied and an output of the amplifier device where the amplified electrical receiving signal is picked up. At least one of the two transfer elements contains the at least one controllable capacitive component. The frequency dependencies of the transfer functions of the two transfer elements are selected so that the two corresponding logarithmic transfer functions in the range of one ramp of each transfer function have a basically straight-line dependence on a bijective function of the frequency. The logarithmic transfer function is proportional to the logarithm of the absolute value of the generally complex transfer function on a given real basis. The logarithmic transfer function of one of the two transfer elements has a positive ramp with a positive slope, while the logarithmic transfer function of the other transfer element has a negative ramps with a negative slope. The slopes of both ramps of the logarithmic transfer functions are selected so that their absolute values are at least approximately equal. The ramps of the two logarithmic transfer functions can now be shifted in relation to one another within the frequency range of the receive signals. The gain of the amplifier device is controlled by shifting the ramps in relation to one another.

For this purpose, the ultrasound device contains controllers effectively connected to at least the transfer element containing the capacitive component. The controllers can shift one ramp toward lower or higher frequencies, while the other ramp remains unchanged, or they can also shift both ramps. The transfer element with the positive ramp (ramp with a positive slope) may contain at least one element of a group of electrical circuits or networks including a high-pass filter of at least first order, a differentiator, and a pre-emphasis unit. The transfer element with the negative ramp (ramp with a negative slope) may contain at least one element of a group of electrical circuits and networks including a low-pass filter of at least first order, an integrator, and a de-emphasis unit. Such transfer elements can also be used with amplifiers with negative feedback.

DETAILED DESCRIPTION

Figure 1:
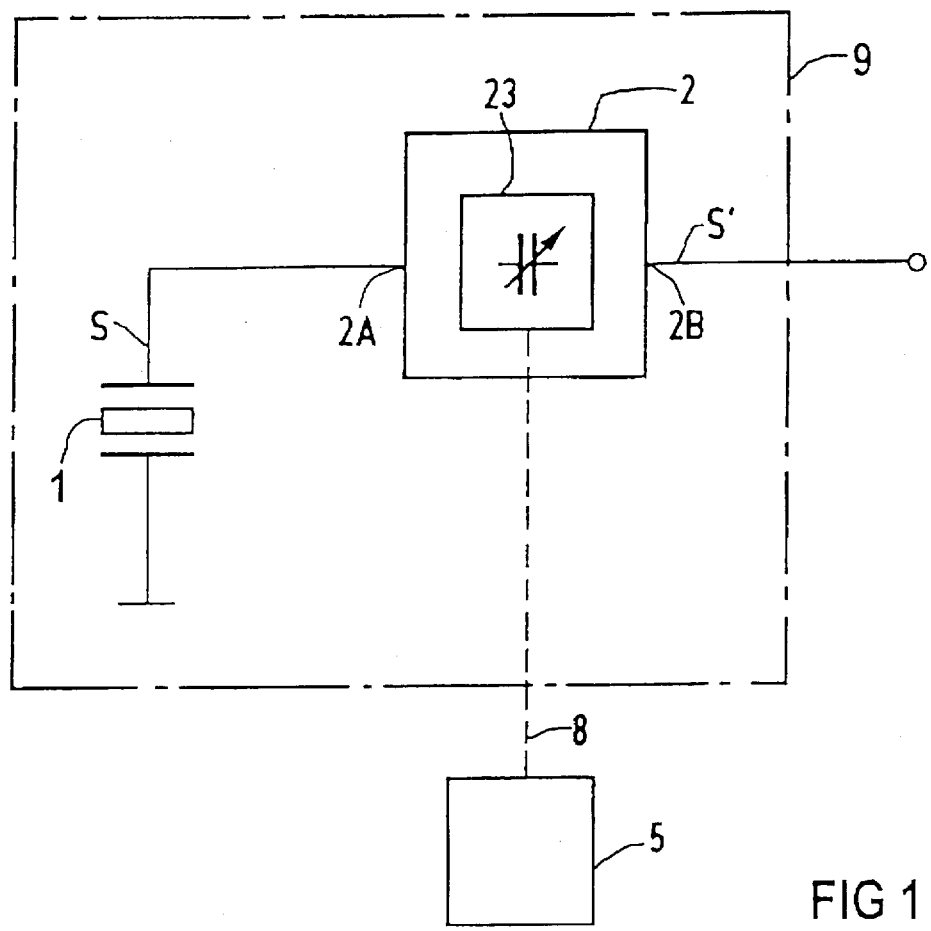
FIG. 1 is a block diagram illustrating an ultrasound transducer head.

An ultrasound transducer head 9, as shown in FIG. 1, contains at least one transducer element 1 and an amplifier device 2 for amplification of electrical receiving signals S of transducer element 1. The electrical receiving signals S of transducer element 1 are applied to an input 2A of amplifier device 2. The amplified receiving signals S' can be picked up at an output 2B of amplifier device 2.

To control its generally complex gain $A^* = S'/S$, amplifier device 2 includes at least one controllable capacitive component 23. Gain $A^*$ of amplifier device 2 depends on a capacitance C of the controllable capacitive component 23. To control capacitance C of capacitive component 23 and thus the gain $A^*$ of amplifier device 2, the at least one capacitive component 23 is connected to controllers 5 through an effective connection represented by dashed line 8. The effective connection of controllers 5 to the at least one capacitive component 23 can be an electrical, optical, inductive, or piezoelectric connection. Effective connection line 8 can then be formed by an electric connection, an optical coupler, an inductive coupler, or a piezocoupler. Controllers 5 are generally located outside transducer head 9, but can also be integrated, at least partially, in transducer head 9.

Any piezoelectric transducer element can be provided as transducer element 1, including but not restricted to a piezoceramic element. Transducer element 1 is preferably part of an ultrasound array (not represented in FIG. 1) with a plurality of transducer elements. The array can be linear or two-dimensional, for example, matrix-shaped. Such arrays are usually integrated in a substrate by microstructuring. A variable-gain amplifier device is then assigned to each transducer element of the array for amplifying the receiving signal of the transducer element. The amplifier devices are integrated in the transducer head together with the transducer elements of the array. The transducer head 9 can be structured to only receive ultrasound or to both send and receive ultrasound.

Figure 2:
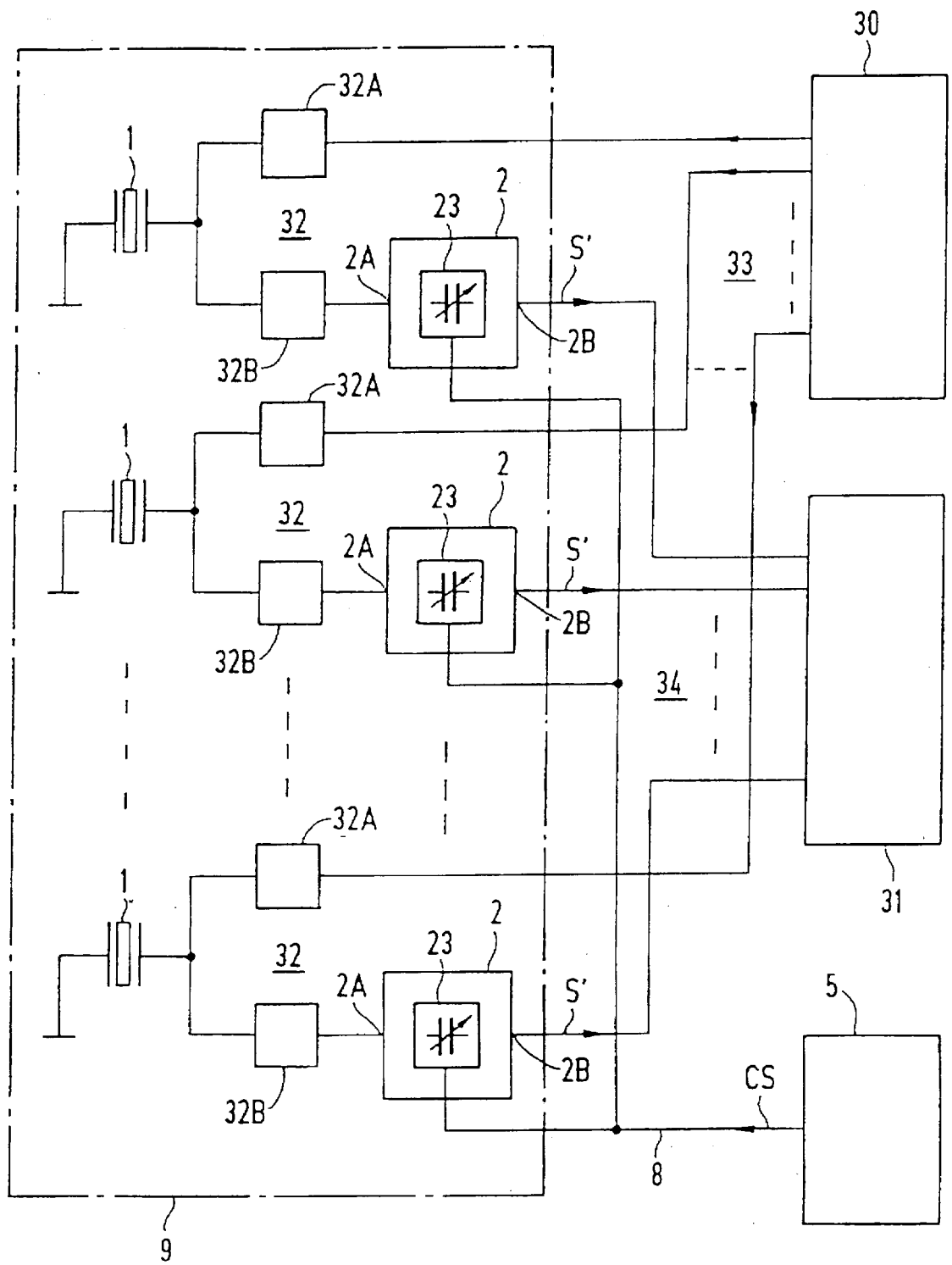
FIG. 2 is a block diagram illustrating an ultrasound device with an ultrasound transducer head.

The ultrasound device for imaging an object (not illustrated) with ultrasound according to FIG. 2 contains a transducer head 9 for both sending and receiving ultrasound with an array of transducer elements 1 and an amplifier device 2 assigned to each transducer element 1. In the transmit mode of the ultrasound device, the object is exposed to with ultrasound pulses of transducer elements 1. For this purpose, a transmitter 30 sends pulses via transmit lines 33 to induce ultrasound vibrations in each transducer element 1. The duration of a single transmit pulse can generally be selected between 50 and 500 ns, preferably approximately 150 ns, and the pulse height (amplitude) of the transmit pulses can be selected between 50 and 150 V. All transducer elements 1 of the array are preferably excited with a phase delay by transmitter 30 to produce a preferably focusable ultrasound beam, which is directed at the object (electronic scan). In the case of a transducer head with a single transducer element 1, however, the object is mechanically scanned by moving transducer element 1 (mechanical scanning). In the receive mode of the ultrasound device, the ultrasound pulses reflected back from the object to transducer elements 1 are converted to electrical receiving signals S in each transducer element 1. The electrical receiving signals S are amplified by the corresponding amplifier device 2 in transducer head 9, and the amplified receiving signals S' are fed to signal processors 31 through signal lines 34 for creating an image of the object. The impedances of amplifier devices 2 are preferably at least approximately matched to the impedances of the respective signal lines 34. A duplexer 32 is preferably provided for each transducer element 1 for switching between transmit mode and receive mode. In the transmit mode, first part 32A of duplexer 32 connects the corresponding transducer element 1 with transmitter 30 and, in the receive mode, disconnects transmitter 30 from both amplifier device 2 and from transducer element 1. In the receive mode, second part 32B of duplexer 32 connects transducer element 1 with amplifier device 2 and, in the transmit mode, disconnects the generally sensitive amplifier device 2 from both transmitter 30 for protection against its transmit pulses and from transducer element 1. Transducer element 1 and both parts 32A and 32B of duplexer 32 are electrically connected to a common switching point. At least part 32B of each duplexer 32, located between transducer element 1 and input 2A of the corresponding amplifier device 2, is integrated with transducer element 1 and amplifier device 2 in transducer head 9. First part 32A can also be located in transducer head 9 as illustrated. For duplexer 32, control lines (not illustrated) can be provided for switching between transmit and receive modes.

Each amplifier device 2 contains at least one controllable capacitive component 23. Each controllable capacitive component 23 is preferably connected through a common electric control line 8 as an effective connection line to controllers 5. Capacitive components 23 are excited by a common control signal CS to control gains A* of amplifier devices 2. This embodiment with a common excitation of all amplifier devices 2 is especially advantageous in the case of transducer elements 1 and amplifier devices 2, of basically identical design and construction, in transducer head 9. Each amplifier device 2 can, however, be effectively connected to controllers 5 through one or more control lines or effective connections 8 for controlling gains A* of amplifier devices 2 independently. In addition, the effective connection between amplifier devices 2 and controllers 5 can be accomplished by one of the other methods described rather than electrically.

Amplifier device 2 contains, in an advantageous embodiment, at least one amplifier whose input is connected to transducer unit 1 and whose output is connected to output 2B of amplifier device 2. In addition, a negative feedback circuit is provided for the at least one amplifier. In the case of a single amplifier, the amplifier output is connected with its input. Part of the output signal of the amplifier is fed back to the input and superimposed on the input signal of the amplifier in phase opposition, so that the effective input signal is weakened. In the case of a plurality of amplifiers connected in series, a negative feedback circuit can be provided for each individual amplifier or a negative feedback circuit across at least two, but preferably all, amplifiers connected in series, or a combination of such single or multiple negative feedback circuits can be provided. In the case of a negative feedback circuit for a plurality of amplifiers connected in series, the output signal of the last amplifier is connected with negative feedback to the input signal of the first amplifier. The negative feedback connection of at least one amplifier contains the at least one controllable capacitive component 23. Then a change in capacitance C of the at least one capacitive component 23 results in a change in the degree of negative feedback and thus in gain A* of amplifier device 2.

Figure 3:
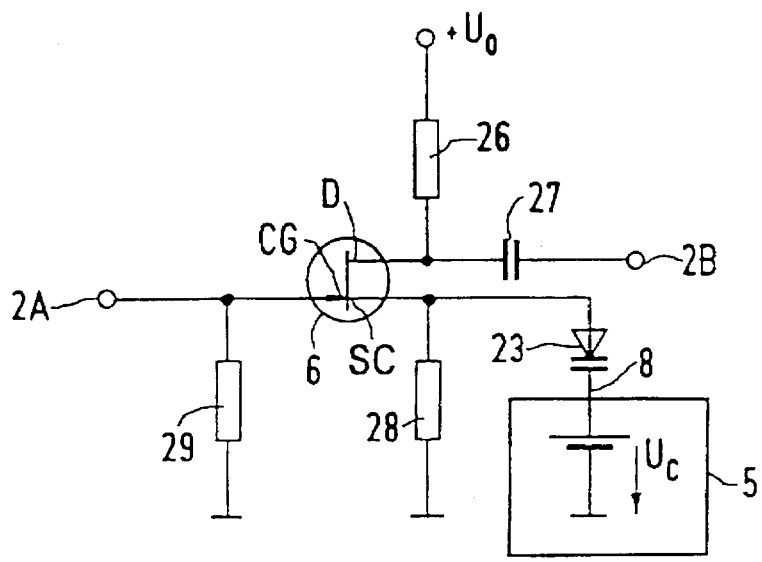
FIG. 3 is a schematic diagram illustrating an amplifier device in a transducer head with an amplifier connected with a negative feedback circuit.

A first embodiment of an amplifier device 2 with an amplifier connected with negative feedback is illustrated in FIG. 3. A field-effect transistor 6 is provided as an amplifier, with a gate CG, a source SC, and a drain D. Gate CG of field-effect transistor 6 is connected to input 2A of amplifier device 2. Source SC of field-effect transistor 6 is connected to a controllable capacitive diode used as a capacitive component 23. Drain D forms the output of the amplifier and is connected to output 2B of amplifier device 2 through a capacitor 27 and to a positive drain voltage $U_0$ through a resistor 26. Controllable capacitive diode 23 is connected, via a control line 8, to a control voltage source used as controllers 5, which biases controllable capacitive diode 23 with a reverse voltage $U_c$ in the reverse direction. Part of the output signal of field-effect transistor 6 is connected with negative feedback to its input signal through controllable capacitive diode 23. Therefore, when capacitance C of controllable capacitive diode 23 is changed by controlling reverse voltage $U_c$, the degree of negative feedback of amplifier 6, and thus gain A* of amplifier device 2, changes. However, the negative feedback with capacitive component 23 and the gain of amplifier device 2 are frequency-dependent due to the influence of capacitance C of capacitive component 23, in the case illustrated in the form of a high-pass relationship. This frequency dependence can, however, be taken into account and corrected when analyzing the amplified receive signal S'. Furthermore, preferably another resistor 29 to establish the gate potential at gate CG of field-effect transistor 6, and a resistor 28, which causes an output signal used for negative feedback to appear at source SC, are provided.

In a particularly advantageous embodiment of amplifier device 2, gain A* of the amplifier device is controlled by controlling capacitance C of at least one capacitive component 23, but basically independently of the frequency. This embodiment is described in more detail using FIGS. 4 through 16.

Figure 4:
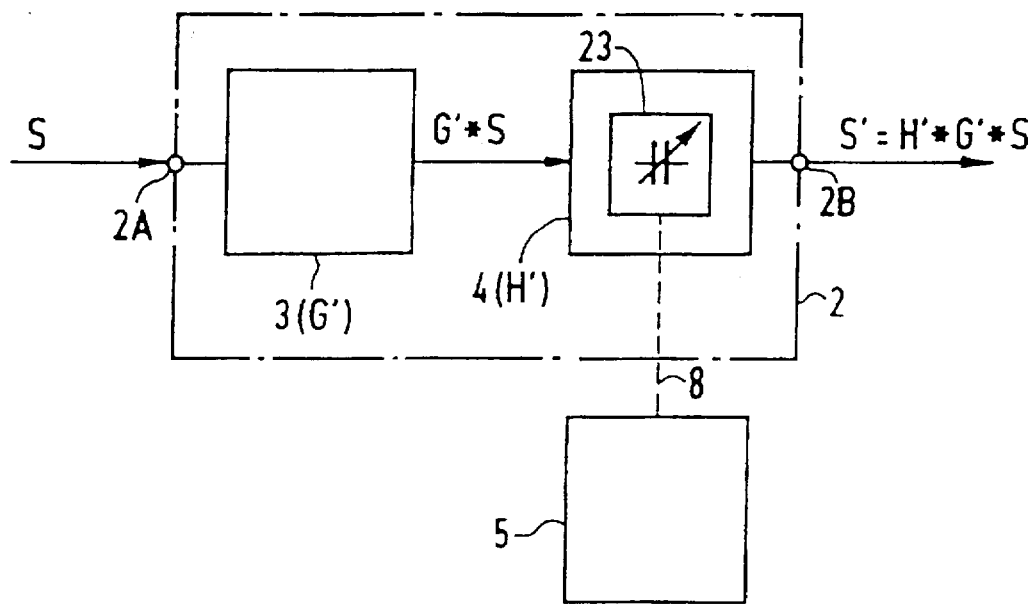
FIG. 4 is a block diagram illustrating an amplifier device in a transducer head with two transfer elements.

FIG. 4 shows the schematic diagram of an amplifier device 2 with frequency-independent gain control. Amplifier device 2 includes a first transfer element 3 with a generally complex transfer function G' and a second transfer element 4 with a generally complex transfer function H'. First transfer element 3 and second transfer element 4 are electrically connected in series between input 2A and output 2B of amplifier device 2. The electrical receiving signal S to be amplified, of transducer element 1, is applied to input 2A of amplifier device 2 and fed to first transfer element 3. In first transfer element 3, the receiving signal S is multiplied by the transfer function G' of first transfer element 3. The receive signal obtained, amplified or multiplied by transfer function G'—G'*S—is now fed to second transfer element 4, where it is amplified with transfer function H'. The receiving signal S'=H'*G'*S, multiplied by both transfer functions G' and H' of both transfer elements 3 and 4, can be picked up at output 2B of amplifier device 2 as an amplified receiving signal.

Thus the following relationship applies between the generally complex amplitude of the amplified receive signal S' at output 2B of amplifier device 2, the generally complex amplitude of the unamplified receive signal S at input 2A of amplifier device 2, and the product H'*G' of the two complex transfer functions G' and H' used as the complex electric gain or complex transfer function A* of the entire amplifier device 2:

$$S'/S = H'*G' \quad (1)$$

Applying the absolute value function | | to the complex quantities on both sides of equation (1), and then applying the logarithm function $\log_a$ on a given real basis a, the real logarithmic gain $$A = \log_a(|S'|/|S|) = G + H \quad (2)$$

of amplifier device 2 is obtained with the real logarithmic transfer functions $$G = \log_a(|G'|)$$

$$H = \log_a(|H'|).$$

Therefore, the logarithmic gain A of amplifier device 2 corresponds to the sum of the logarithmic transfer functions $G=\log_a(|G'|)$ and $H=\log_a(|H'|)$ of the two transfer elements 3 and 4 of amplifier device 2.

At least one of the two transfer elements 3 or 4 contains at least one controllable capacitive component 23. Controllers 5 are effectively connected to each of these controllable capacitive components 23 in amplifier device 2. In the example of FIG. 4, controllers 5 are only connected with one capacitive component in transfer element 4 through effective connection line 8 drawn as a dashed line. Controllers 5 control each capacitive component 23 connected to them in transfer element 3 or 4, so that the frequency dependence of transfer function G' or H' of this transfer element 3 or 4, respectively, is modified. The exact operation of this control is explained below.

Figure 5:
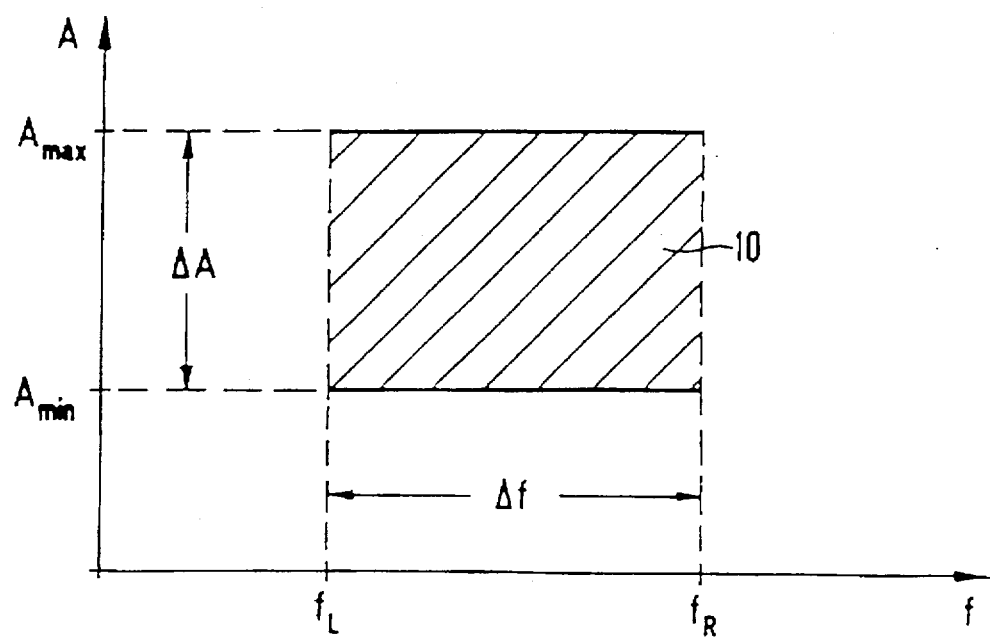
FIG. 5 is a diagram representing a typical dependence of the gain of an amplifier device on the frequency of an electrical receiving signal.

FIG. 5 shows, diagrammatically, how the logarithmic gain $A=\log_a(|S'|/|S|)$ of amplifier device 2 should be preferably controlled. In a given ultrasound frequency range denoted by $\Delta f$ between a left-hand cut-off frequency $f_L$ and a right-hand cut-off frequency $f_R$, the logarithmic gain A should be variable between a minimum gain $A_{min}$ and a maximum gain $A_{max}$ by a gain variation $\Delta A = A_{max} - A_{min} > 0$ while remaining basically frequency-independent at least within the given frequency range $\Delta f$. The corresponding given rectangular gain control range, defined by $\Delta f$ and $\Delta A$, is shaded and denoted with 10. The minimum logarithmic gain $A_{min}$ is, in general, selected to be greater than or equal to zero, but can also be smaller than zero. Also the maximum gain $A_{max}$ can be smaller than zero. The absolute value of the amplitude of output signal S' of amplifier device 2 is in these cases smaller than the amplitude of input signal S.

In order to achieve a gain variation $\Delta A$ according to FIG. 5 within the given frequency range $\Delta f$, the logarithmic transfer functions $G=\log_a(|G'|)$ and $H=\log_a(|H'|)$ of the two transmission components 3 and 4, respectively, are set so that they are at least approximately linear functions $$G = -m*[v(f) - v_G] \quad (3a)$$

$$H = +m*[v(f) - v_H] \quad (3b)$$

of a bijective function $v=v(f)$ of frequency f of the receiving signals S in at least one given frequency range. The bijective or single-valued function $v(f)$ of frequency f determines the scale on which frequency f is represented and is preferably equal to $\log_a(f)$, specifically $\log(f) = \log_{10}(f)$, or equal to the identical function $I(f)=f$. The first real transfer parameter $m \neq 0$ provides the absolute value of the slopes $|dG/dv|$ and $|dH/dv|$ of the two logarithmic transfer functions G and H in their linear ranges that vary according to equations (3a) and (3b), respectively. The other real transfer parameters $v_G$ and $v_H$ of logarithmic transfer functions G or H, respectively, correspond to function value $v(f_G)$ or $v(f_H)$, of function $v(f)$ at a point $f=f_G$ or $f=f_H$, respectively. Thus the logarithmic transfer function G of transfer element 3 has a linear ramp with slope $-m$ in its frequency range, while the logarithmic transfer function H of the second transfer element 4 has a linear ramp with slope $+m$ in its frequency range. The slopes of both ramps are different in their signs, but equal in their absolute values.

The two logarithmic transfer functions G and H of transfer elements 3 and 4, respectively, are now set so that both logarithmic transfer functions G and H are linear according to equations (3a) and (3b) in the given frequency range $\Delta f = [f_L, f_R]$ and the corresponding interval $\Delta f = [v(f_L), v(f_R)]$ shown in FIG. 5. Then, substituting relationships (3a) and (3b) in equation (2) for the logarithmic gain A of amplifier device 2, the expression $$A = m*(v_G - v_H) \quad (4)$$

is obtained, at least approximately. At least for frequencies f in frequency range $\Delta f$ or, for function values $v(f)$, in the corresponding single-valued determined range $\Delta v$, the logarithmic gain A—and thus, of course, also the complex gain A*—of amplifier device 2 is therefore, at least approximately, frequency-independent.

This virtually frequency-independent value of logarithmic gain A according to equation (4) can now be changed in a manner appropriate for a given application of amplifier device 2 by suitably setting at least one of the transfer parameters m, $v_G$ and $v_H$ of the two logarithmic transfer functions G and H. The gain variation $\Delta A$ of amplifier device 2 is dependent on the variation $\Delta m$ of the absolute value m of the slopes of the two logarithmic transfer functions G and H in the range of their ramps and/or the variation $\Delta v_G$ of the transfer parameter $v_G$ of the ramp of logarithmic transfer function G and/or the variation $\Delta v_H$ of the transfer parameter $v_H$ of the ramp of logarithmic transfer function H. The variations $\Delta v_G$ and $\Delta v_H$ correspond to a shift of the ramp of the respective logarithmic transfer function G or H, respectively. Variation Δm corresponds to a change in the absolute steepness of both ramps.

Figure 6:
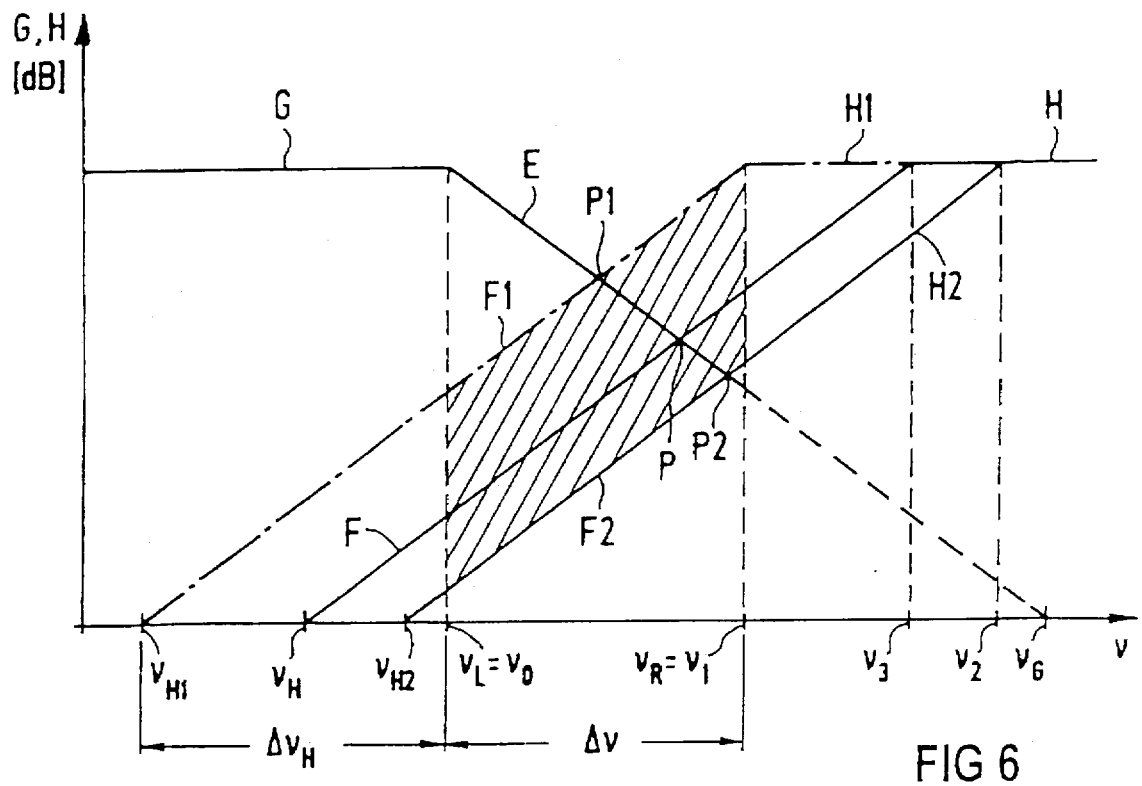
FIGS. 6, 7 and 8 are diagrams illustrating the shifting of the ramps of the transfer functions of the transfer elements of an amplifier device.
Figure 7:
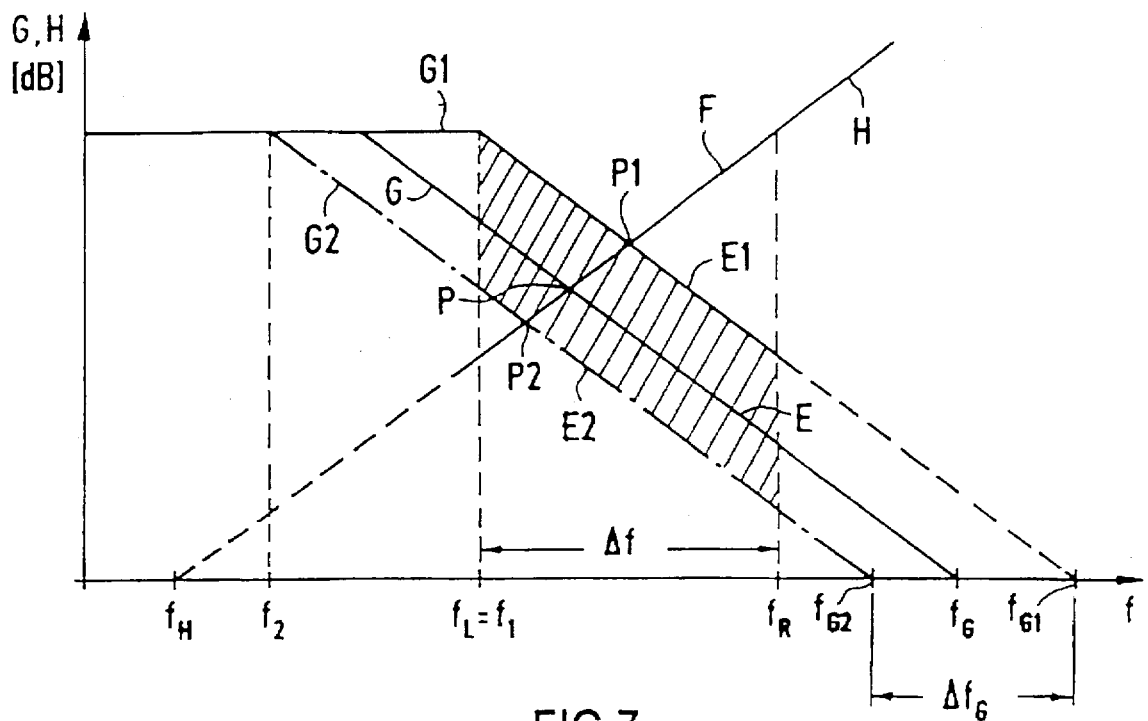
Figure 8:
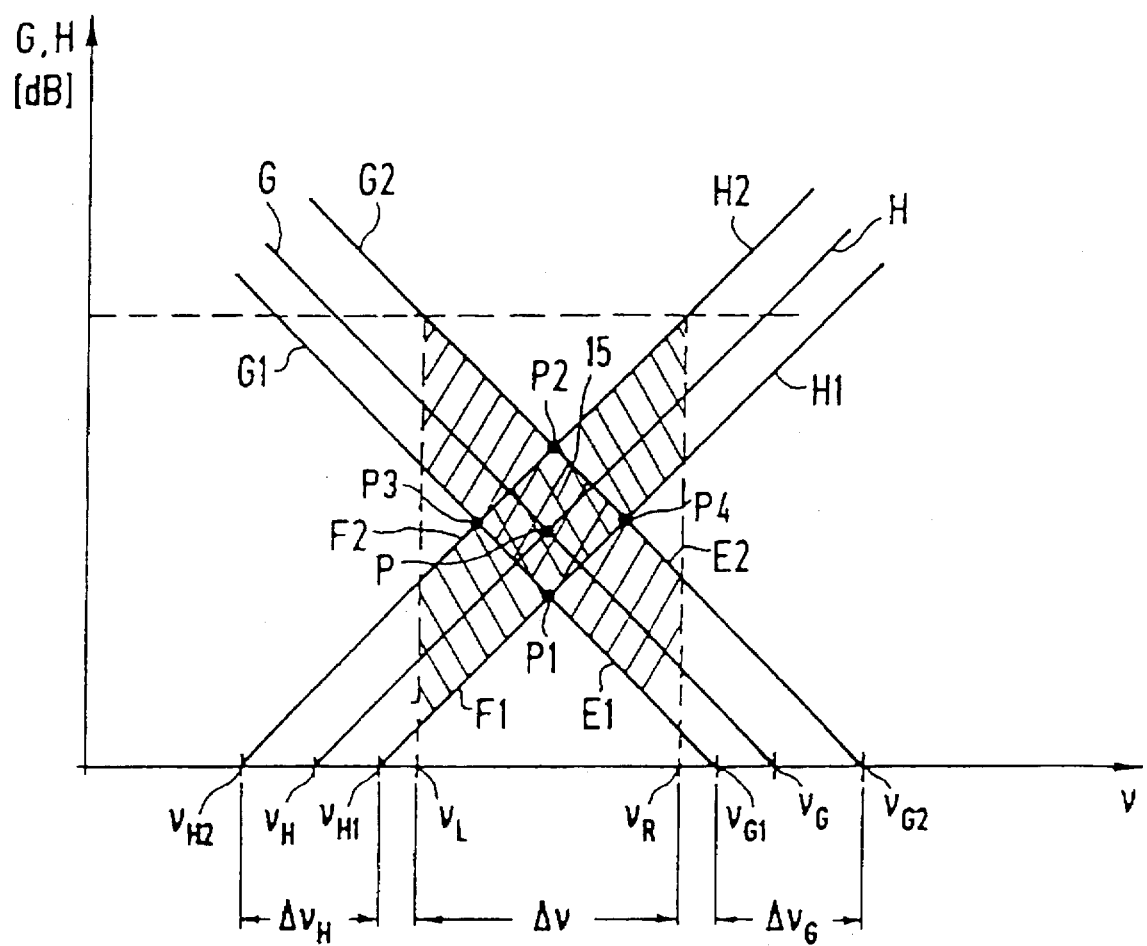

The exact variation of the logarithmic transfer functions G and H of the two transfer elements 3 and 4 outside the given frequency range $\Delta f=(f_L,f_R)$ or the corresponding interval $\Delta v=[v(f_L),v(f_R)]$ is unimportant for the control of gain A. FIGS. 6 through 8 show how the logarithmic gain A of amplifier device 2 can be controlled by varying the logarithmic transfer functions G and H of the two transfer elements 3 and 4. The decimal logarithmic gain or transfer function $$A/dB=20 \log (|S'|/|S|)$$

$$G/dB=20 \log (|G'|)$$

$$H/dB=20 \log (|H'|),$$

can be used, with the decimal logarithm $\log=\log_{10}$, as commonly used in electronics.

FIGS. 6 and 7 show embodiments where the ramp of one of the two logarithmic transfer functions is varied and the ramp of the other logarithmic transfer function is maintained constant. In the embodiment according to FIG. 8, the ramps of both logarithmic transfer functions are varied.

In the diagram of FIG. 6, two logarithmic transfer functions G and H are plotted against the function $v=v(f)$. For values $v \leq v_0$, the logarithmic transfer function G of the first transfer element 3 is virtually constant to the left of a function limit value $v_0$ and decreases basically linearly, according to equation (3a), along a ramp E to the right of this function limit value $v_0$ for $v>v_0$ with a positive transfer parameter m>0. Such a transfer function G is characteristic for a low-pass filter (or low-pass amplifier) used as transfer element 3. Function limit value $v_0$ corresponds to the value of function $v(f)$ for the cut-off frequency of the low pass filter. The transfer parameter $v_G$ corresponds to the value of v for which the extension of ramp E intersects the abscissas. For $v=v_G$, the logarithmic transfer function G assumes a predefined value, for example, 0 dB. Ramp E of the logarithmic transfer function G is maintained constant during the operation of amplifier device 2. The logarithmic transfer function H of the second transfer element 4 has a linearly increasing ramp F with slope +m>0 with increasing v, according to equation (3b), which goes over to a basically constant portion of the logarithmic transfer function H from a certain function limit value $v_3$. This logarithmic transfer function H corresponds to the characteristic curve of a high-pass filter used as transfer element 4.

Ramp F of the logarithmic transfer function H can now be shifted between two ramps F1 and F2 of two corresponding logarithmic transfer functions H1 and H2 with the same slope +m. As the ramp of logarithmic transfer function H is shifted, its transfer parameter $v_H$ will vary in the interval limited by the two logarithmic transfer parameters $v_{H1}$ and $v_{H2}$ of the two logarithmic transfer functions H1 and H2 with $v_{H1}<v_{H2}$. Transfer parameters $v_H$, $v_{H1}$ and $v_{H2}$ correspond to values v for which the extended ramps F, F1, and F2, respectively, intersect the abscissas. For $v=v_H$, $v=v_{H1}$ or $v=v_{H2}$, the corresponding logarithmic transfer functions H, H1 or H2 assume a predefined value, for example 0 dB, again. The slope of the logarithmic transfer function H, defined by the transfer parameter +m, remains unchanged when ramp F is shifted. The selected variation $\Delta v_H=v_{H2}-v_{H1}$ of transfer parameter $v_3$ corresponds, in this embodiment, to a variation of the function limit value $v_3$ between function limit value $v_1$ of the first logarithmic transfer function H1 and function limit value $v_2$ of the second logarithmic transfer function H2, which in turn corresponds to a variation of the high-pass filter's cut-off frequency. Thus, ramp F of the logarithmic transfer function H in the shaded area can be shifted in relation to ramp E of the logarithmic transfer function G over a function value range Δv located between the function limit value $v_0$ of the logarithmic transfer function G of the low-pass filter (left-hand function value $v_1$) and the smallest function limit value $v_1$ of the logarithmic transfer function H of the high-pass filter (right-hand function value $v_R$).

The point of intersection P of the two ramps E and F is located on flank E between the two extreme points of intersection P1 of ramp F1 with ramp E and P2 of ramp F2 with ramp E. The logarithmic gain A of amplifier device 2 can be obtained graphically as twice the value of one of the two logarithmic transfer functions G or H at this point of intersection P. The maximum value $A_{max}$ of the logarithmic gain A corresponds to point of intersection P1; the minimum value $A_{min}$ corresponds to point of intersection P2.

By varying $\Delta v_H=v_{H2}-v_{H1}$ of ramp F of the logarithmic transfer function H between ramps F1 and F2, we can thus obtain a variation $\Delta A=A_{max}-A_{min}$ of the logarithmic gain A of amplifier device 2 between the two extreme values $A_{max}$ and $A_{min}$ in function value range Δv and therefore in the corresponding frequency range Δf for the electric signal S. The gain variation ΔA is obtained, according to equation (4) as $$\Delta A=|m|*\Delta v_H, \quad (5)$$

thus, it is proportional to the variation $\Delta v_H$ of the transfer parameter $v_H$ of the logarithmic transfer function H of the second transfer element 4 with the absolute value of transfer parameter m as the proportionality constant.

In the diagram of FIG. 7, both logarithmic transfer functions G and H are plotted against frequency f, i.e., the function $v(f)=f$ has been selected. In the embodiment shown, the logarithmic transfer function H with ramp F having a positive slope (positive ramp) is maintained constant, while the logarithmic transfer function G with ramp E having a negative slope (negative ramp) is varied. The transfer parameter $f_H$ of the logarithmic transfer function H therefore remains constant. The transfer parameter $f_G$ of the logarithmic transfer function G, on the other hand, is controlled between the two transfer parameters $f_{G2}$ and $f_{G1}$ by two logarithmic transfer functions G2 and G1 with $f_{G2}<f_{G1}$. The corresponding variation of $f_G$ is designated as $\Delta f_G=f_{G1}-f_{G2}$. Ramp E of the logarithmic transfer function G can thus be shifted, with no change in the slope m, between the two ramps E2 and E1 of the two logarithmic transfer functions G2 and G1, respectively, in a frequency range Δf between a left-hand cut-off frequency $f_L$ and a right-hand cut-off frequency $f_R$, with $f_L<f_R$. The range of variation of ramp E over the frequency range Δf is shown cross hatched.

Point of intersection P of the two ramps E and F varies between point of intersection P2 of ramp E2 with ramp F and point of intersection P1 of ramp E1 with ramp F. The resulting logarithmic gain A of amplifier device 2 again corresponds to twice the logarithmic transfer function G or H at point of intersection P. The variation ΔA of the logarithmic gain A between its maximum value $A_{max}$ and its minimum value $A_{min}$ is, according to equation (4), basically equal to $$\Delta A=|m|*\Delta f_G \quad (6)$$

i.e., proportional to the variation $\Delta f_G$ of the transfer parameter $f_G$ of the logarithmic transfer function G of first transfer element 3, with the absolute value of the transfer parameter m as the proportionality constant.

The logarithmic transfer function G can again be implemented with a transfer element 3 having a low-pass filter character. In the embodiment illustrated, a variation $\Delta f_G$ of the transfer parameter $f_G$ from $f_{G2}$ to $f_{G1}$ then corresponds to a variation of the cut-off frequency of the low-pass filter from $f_2$ to $f_1$. The logarithmic transfer function H shown has a passing ramp F and can, for example, be implemented using a differentiator in transfer element 4.

In the embodiment of FIG. 8, ramps E and F of both logarithmic functions G and H can be shifted within the given function value interval $\Delta v$. The transfer parameter $v_G$ of the logarithmic transfer function G of first transfer element 3 is controlled in the variation interval defined by the two transfer parameters $v_{G1}$ and $v_{G2}$ of the two logarithmic transfer functions G1 and G2, with $v_{G1}<v_{G2}$. The maximum variation of the transfer parameter $v_G$, corresponding to the length of the variation interval, is denoted with $\Delta v_G = v_{G2} - v_{G1}$. Transfer parameter $v_H$ of the logarithmic transfer function H of second transfer element 4 is, on the other hand, varied in the variation interval defined by the two transfer parameters $v_{H1}$ and $v_{H2}$ of the two logarithmic transfer functions H1 and H2, with $v_{H1}<v_{H2}$, with a maximum variation $\Delta v_H = v_{H1} - v_{H2}$. The corresponding variation ranges of ramps E and F over the interval $\Delta v$ are shaded.

Point of intersection P of the two ramps E and F is located in the cross hatched, parallelogram-shaped area 15 with the four corner points P1, P2, P3, and P4. Corner point P1 is the point of intersection of the two ramps E1 and F1; corner point P2 is the point of intersection of the two ramps E2 and F2; corner point P3 is the point of intersection of the two ramps E1 and F2; corner point P4 is the point of intersection of the two ramps E2 and F1. Gain A of amplifier device 2 is maximum, i.e., $A = A_{max}$ when point of intersection P=P2 and minimum, i.e., $A = A_{min}$ when point of intersection P=P1.

The variation $\Delta A$ of gain A is now at least approximately equal to
$$\Delta A = |m|^*(\Delta v_G + \Delta v_H) \qquad (7)$$

Compared to the variation $\Delta v_G$ or $\Delta v_H$ of ramp E or F of only one transfer function G or H, the variation $\Delta A$ of gain A is thus equal to the sum of the individual variations $\Delta A$ according to equations (7) or (8) when both transfer parameters $v_G$ and $v_H$ are varied. In the case of equal variations $\Delta v_G = \Delta v_H$ when both ramps E and F are shifted by changing their respective transfer parameters $v_G$ and $v_H$, the gain variation $\Delta A$ is twice as great as in the case of a variation of only one transfer parameter $v_G$ or $v_H$, i.e., when only one ramp E or F is shifted.

Therefore, in all the embodiments of the two transfer elements 3 and 4 of amplifier device 2, depending on frequency f of the input signal S or the bijective function v(f) of this frequency, each of the logarithmic transfer functions G and H of the two transfer elements 3 and 4 has at least one linear ramp E and F, with opposite slopes and both of these ramps E and F can be shifted in relation to one another in the given frequency range $\Delta f$ (or $\Delta v(f)$). Outside this frequency range $\Delta f$ (or $\Delta v(f)$), the frequency of transfer elements 3 and 4 can, in principle, vary in any manner. The sequence of the transfer element with the positive ramp and the transmitter with the negative ramp in the circuit arrangement between input 2A and output 2B of amplifier device 2 is also interchangeable.

A transfer element with a positive ramp such as ramp F in FIGS. 6 through 8, can be preferably designed with the help of a high-pass filter of the nth order with $n \geq 1$, a differentiator or a pre-emphasis unit. A transfer element with a negative ramp such as, for example, ramp E in FIGS. 6 through 8, contains preferably a low-pass filter of the nth order with $n \geq 1$, an integrator, or a de-emphasis unit. Each transfer element comprises at least one amplifier for setting the absolute value of the corresponding transfer function.

Furthermore, in a non-illustrated embodiment, amplifier device 2 may also have at least one amplifier with a frequency-independent gain in at least one frequency range $\Delta f$, which is connected electrically in series to both transfer elements 3 and 4. The aforementioned embodiments for transfer elements 3 and 4 of amplifier device 2 are known to the person skilled in the art in a number of versions. FIGS. 9 through 14 show simple basic circuits for such transfer elements. All transfer elements illustrated contain an amplifier 20 connected with negative feedback with an input 20A and an output 20B, as well as a capacitive component 23. The input of the transfer element corresponds to point 40, and the output of the transfer element corresponds to point 50. Circuit point 50 is electrically connected to output 20B of amplifier 20.

Figure 9:
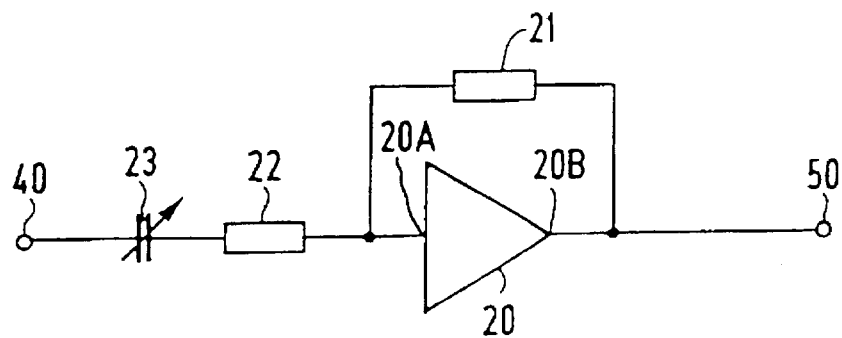
FIGS. 9, 10 and 11 are schematic diagrams illustrating embodiments of a transfer element with a positive ramp.

FIG. 9 shows a basic circuit of a high-pass filter of the first order (n=1). Input 20A of amplifier 20 is connected with feedback to output 20B of amplifier 20 via a first electric resistor 21. A minus sign at input 20A of amplifier 20 should indicate that the feedback portion of the output signal reduces the input signal, i.e., there is a negative feedback. An input signal at input 40 of the high-pass filter is switched to input 20A of amplifier 20 via a series circuit of a second electric resistor 22 and the controllable capacitive component 23. The cut-off frequency of the high-pass filter is now proportional to 1/(RC), where K is the electrical resistance of the second resistor 22 and C is the capacitance of capacitive component 23. A high-pass filter of the nth order with n>1 can be designed simply by connecting n high-pass filters of the 1st order in series. The slope of the increasing positive ramp of the high-pass filter of the nth order corresponds to the n-fold slope of the positive ramp of the 1st-order high-pass filter. By using a higher order high-pass filter for a transfer element, the gain variation $\Delta A$ of amplifier device 2 can be multiplied accordingly.

Figure 10:
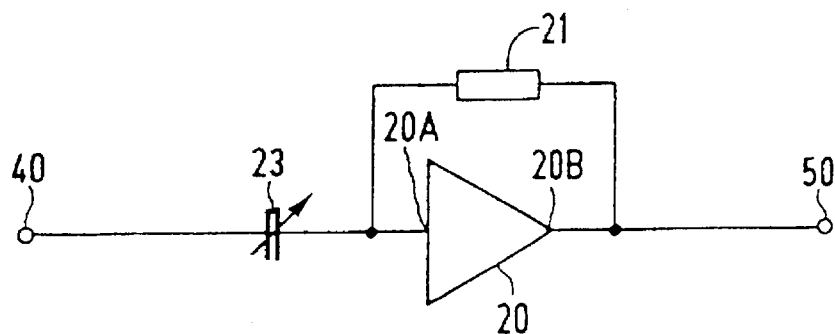

FIG. 10 shows an embodiment of a differentiator. Output 20B of amplifier 20 is electrically connected to input 20A via resistor 21. Capacitive component 23 is connected between input 20A of the amplifier and input 40 of the differentiator connected with negative feedback. This differentiator is obtained from the basic circuit for the high-pass filter according to FIG. 9 by omitting the second resistor 22. The differentiator has no cut-off frequency.

Figure 11:
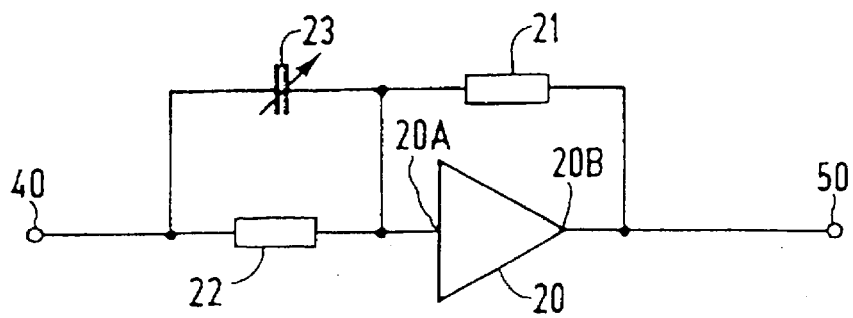

In the case of the pre-emphasis unit according to FIG. 11, output 20B of amplifier 20 is also connected with negative feedback to input 20A of amplifier 20 via first resistor 21. Input 40 of the pre-emphasis unit is now electrically connected to input 20A of amplifier 20 via second resistor 22 and capacitive component 23 connected in parallel. The cut-off frequency of the pre-emphasis unit is proportional to 1/(RC), where R is the ohmic resistance of the second resistor 22 and C is the electrical capacitance of capacitive component 23.

Figure 12:
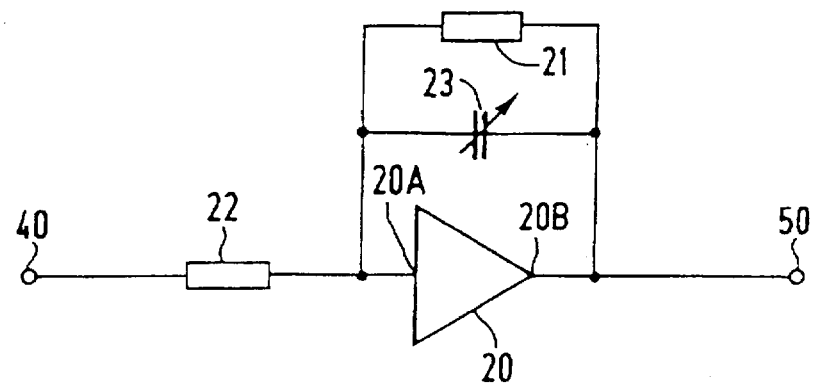
FIGS. 12, 13 and 14 are schematic diagrams illustrating embodiments of a transfer element with a negative ramp.

FIG. 12 shows the embodiment of a first-order low-pass filter. Output 20B of amplifier 20 is electrically connected to input 20A of amplifier 20 via first resistor 21 and capacitive component 23 connected in parallel. Input 40 of the low-pass filter is electrically connected to input 20A of amplifier 20 via the second resistor 22. The cut-off frequency of the low-pass filter is proportional to 1/(RC), where R is the ohmic resistance of the first resistor 21 and C is the electrical capacitance of capacitive component 23. An nth-order low-pass filter with n>1 can be designed simply by connecting n first-order low-pass filters in series. The slope of the decreasing negative ramp of the nth order low-pass filter corresponds to the n-fold slope of the negative ramp of the first-order low-pass filter. By using a higher order low-pass filter as a transfer element, the gain variation ΔA of amplifier device 2 can therefore be multiplied accordingly.

Figure 13:
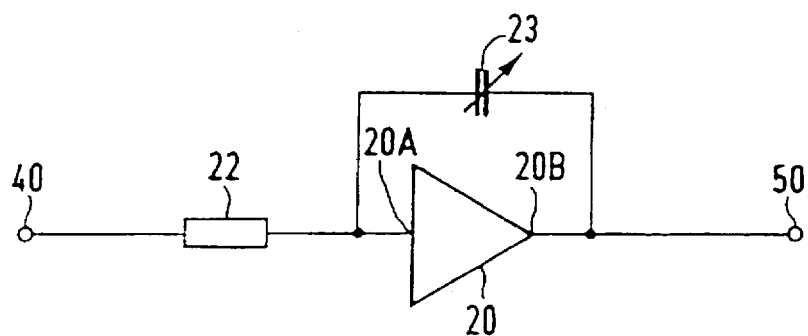

FIG. 13 illustrates an embodiment of an integrator. Output 20B and input 20A of amplifier 20 are electrically connected with negative feedback through capacitive component 23. Resistor 22 is connected in advance from input 20A of amplifier 20. The integrator according to FIG. 13 can be obtained by omitting resistor 21 in the transfer element according to FIG. 12. The integrator has no cut-off frequency.

Figure 14:
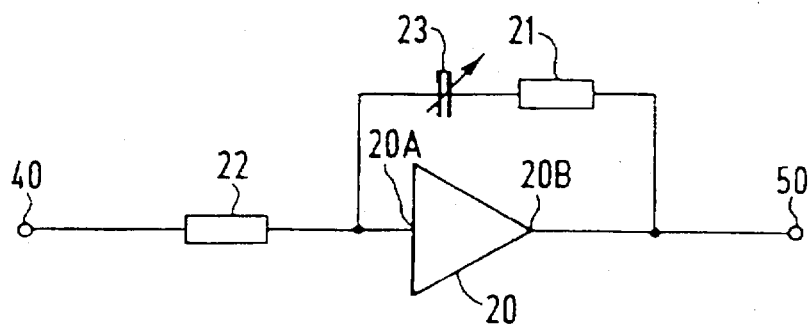

Finally, FIG. 14 shows a basic circuit of a de-emphasis unit used as a transfer element. First resistor 21 and capacitive component 23, connected in series, are connected between output 20B and input 20A of amplifier 20. Input 20A of amplifier 20 is furthermore electrically connected to input 40 of the de-emphasis unit via second resistor 22. The cut-off frequency of the de-emphasis unit is proportional to 1/(RC), where R is the ohmic resistance of the first resistor 21 and C is the electrical capacitance of capacitive component 23.

In all embodiments of the transfer element according to FIGS. 9 through 14, controllers 5 are provided for shifting ramps E and F of the transfer functions G and H of transfer elements 3 and 4, respectively, in relation to one another. Controllers 5 control the at least one capacitive component 23 of each transfer element to be controlled. A controllable capacitive diode, to which controllers 5 can apply a variable reverse voltage used as a control voltage, is preferably provided as a capacitive component 23 in all embodiments of amplifier device 2. Controllable capacitive diodes have precisely defined characteristic curves of their capacities as functions of the reverse voltage applied. Thus amplifier devices 2 of the different transducer elements 1 of an array, for example, in an embodiment according to FIG. 2, have good synchronism characteristics.

In an embodiment not illustrated, a normally-off field-effect transistor can also be provided as a controllable capacitive component 23. A control voltage is applied to the source-drain portion of this normally-off field-effect transistor, electrically short-circuiting its source and gate. The capacitance between source and gate is varied using the control voltage.

A special advantage of a capacitive control of the gain of amplifier device 2 in one of the above-described embodiments is the low power loss in such a control.

Figure 15:
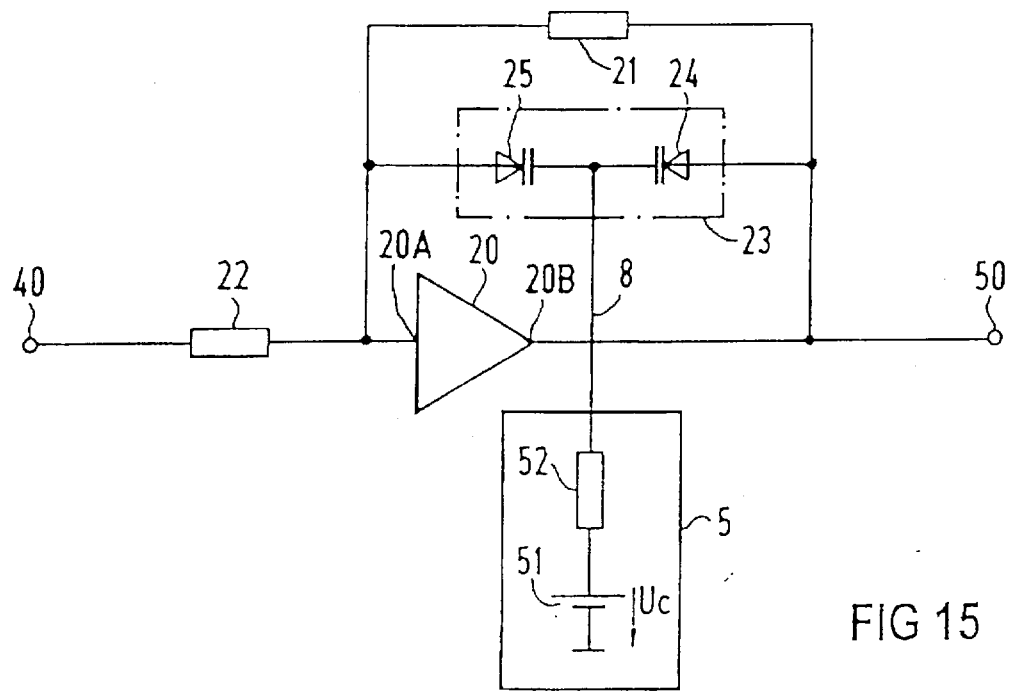
FIG. 15 is a block diagram illustrating a transfer element with two controllable capacitive diodes.

FIG. 15 shows the embodiment of a low-pass filter according to FIG. 12, where the capacitive component 23 comprises two controllable capacitive diodes 24 and 25 connected in parallel. Controllers 5 apply a control voltage $U_c$ to both controllable capacitive diodes 24 and 25, for example, via an electrical control conductor 8 in the reverse direction. Controllers 5 preferably contain a bias resistor 52 and a control voltage source 51, which provides control voltage $U_c$. Control voltage $U_c$ is preferably selected so that neither of the two controllable capacitive diodes 24 or 25 becomes conductive beyond the expected modulation range of amplifier 20. In order to control the ramps of both transfer elements 3 and 4 together, as in the embodiment according to FIG. 8, controllers 5 may contain a common control voltage source provided for both transfer elements 3 and 4, which is connected to the controllable capacitive components of both transfer elements 3 and 4.

Figure 16:
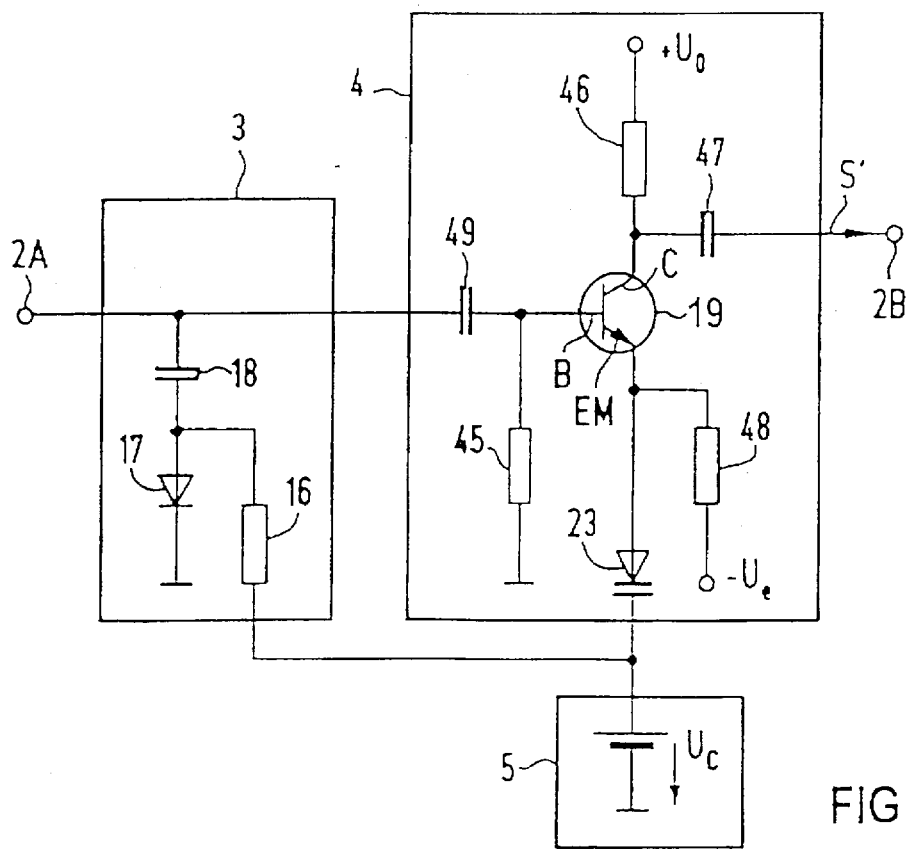
FIG. 16 is a schematic diagram illustrating an amplifier device in a transducer head with two special transfer elements and common controllers.

FIG. 16 shows an embodiment of an amplifier device 2 with controllers 5 common to both transfer elements 3 and 4. The first transfer elements 3 contains a resistor 16, a pin diode 17, and a capacitor 18. The second transfer element 4 contains at least a bipolar transistor 19 used as an amplifier and a negative feedback circuit for this at least one amplifier, which contains at least one controllable capacitive diode used as a controllable capacitive component 23. Base B of bipolar transistor 19 is preferably connected to input 2A of amplifier device 2 via a capacitor 49 and the first transfer element 3. Collector C of bipolar transistor 19 is connected to output 2B of amplifier device 2 through a capacitor 47. Furthermore, a positive supply voltage $[+U_0]$ is applied to collector C of bipolar transistor 19 via a bias resistor 46. A negative emitter voltage $-U_e$ is applied to emitter EM of bipolar transistor 19 via bias resistor 48. The signs of the two fixed voltages $+U_0$ and $-U_e$ apply to an npn transistor 19 and should, of course, be reversed for a pnp transistor. A controllable capacitive diode used as a controllable capacitive component 23 is connected between emitter EM of bipolar transistor 19 and a control voltage source used as controller 5 in an emitter circuit for bipolar transistor 19. Controllers 5 apply a control voltage $U_c$ to controllable capacitive diode 23 operated in the reverse direction to control the capacitance of controllable capacitive diode 23. Transfer element 4 is a pre-emphasis unit by its frequency characteristics. Thus its positive ramps can be shifted by changing control voltage $U_c$. Another resistor 45 is connected against zero potential between capacitor 49 and bipolar transistor 19 to determine the base potential at base B of transistor 19. Controllers 5 are also connected to the first transfer element 3. Control voltage $U_c$ is applied to a circuit point between pin diode 17 and capacitor 18 via resistor 16. The serial circuit formed by capacitor 18 and pin diode 17 is connected between input 2A of amplifier device 2 and zero potential. By its frequency response, the first transfer element 3 forms, together with the internal resistance of transducer element 1, a low-pass filter. The resistance of pin diode 17 can be varied through control voltage $U_c$ of controllers 5. The cut-off frequency of the low-pass filter formed with the first transfer element 3, however, also changes with the resistance of pin diode 17. Therefore, in addition to the positive ramp of the second transfer element 4, also the negative ramp of the first transfer element 3 can be shifted by controlling control voltage $U_c$.

Both controllable capacitive diodes and pin diodes have reproducible characteristic curves. Therefore, amplifier devices 2 in the embodiment according to FIG. 16 have good synchronism characteristics as is required for arrays of transducer elements 1. Although pin diode 17 is operated in the conducting direction, only relatively small currents, of typically less than 80 μA, are required for controlling its resistance due to the relatively high internal resistance of transducer element 1. The maximum power loss is therefore typically only a few hundred μW. Since electrical receiving signals S are weakened by transfer element 3 with pin diode 17, a lower bias current of no more than 100 μA is sufficient for bipolar transistor 19, connected with negative feedback. The power loss of the entire amplifier device 2 is therefore very low.

With the embodiment illustrated in FIG. 16, a gain variation as shown in FIG. 8 can be achieved. The logarithmic gain A of amplifier device 2 is maximum for a control voltage tending to zero $U_c$=0 V. The maximum gain $A=A_{max}$ is determined by the impedance of the individual circuit elements in transfer elements 3 and 4. The minimum gain $A_{min}$ and thus the modulation and the dynamic response of amplifier device 2 can be determined by setting the maximum control voltage $U_c$ that can be applied. Instead of a single bipolar transistor 19 used as an amplifier, a larger broad band cascade connection of a plurality of bipolar transistors can also be provided.

In a non-illustrated embodiment, amplifier device 2 may also contain only one transfer element 3 or 4 of one of the above-described embodiments connected between input 2A and output 2B, with at least one capacitive component 23. In this embodiment of amplifier device 2, although no compensation of the frequency response of the capacitive control of gain A* or A is performed in transducer head 9, this frequency response can also be corrected using a signal processor connected downstream.

In all embodiments of amplifier device 2, devices such as, but not limited to, bipolar transistors, field-effect transistors, including, but not limited to MOSFETs, but also integrated operational amplifiers can be used as amplifiers connected with negative bias. These three types of amplifiers are especially suitable for integration with an array of transducer elements 1 in transducer head 9.

What is claimed is:

1. An ultrasound transducer head, comprising:
   at least one transducer element for receiving ultrasound signals and converting said ultrasound signals into electrical signals; and
   an amplifier device for electrically amplifying the electrical signals of the transducer element, the amplifier device including at least one controllable capacitive component for controlling the gain of the amplifier device.

2. The ultrasound transducer head according to claim 1, wherein the amplifier device includes at least one amplifier and a negative feedback circuit containing the at least one controllable capacitive component.

3. The ultrasound transducer head according to claim 2, wherein the amplifier is comprised of a field-effect transistor having a gate and a source, the gate electrically connected to the transducer element and the source connected to the at least one controllable capacitive component.

4. The ultrasound transducer head according to claim 2, wherein the amplifier is comprised of a bipolar transistor having a base and an emitter, the base connected to the transducer element and the emitter connected to the at least one controllable capacitive component.

5. The ultrasound transducer head according to claim 1, wherein the amplifier device includes two transfer elements, at least one transfer element having at least one controllable capacitive component, the transfer elements being electrically connected in series between an input and an output of the amplifier device, each transfer element having a frequency-dependent logarithmic transfer function with a ramp that is substantially linearly dependent on a bijective function of the frequency with the slopes of both ramps of the two transfer functions having substantially equal absolute values and opposite signs, and wherein the ramps of the transfer functions of both transfer elements can be shifted in relation to one another within a frequency range of the electrical signals.

6. The ultrasound transducer head according to claim 5, wherein the transfer element whose transfer function has a ramp with a positive slope includes at least one of a high-pass filter of at least the first order, a differentiator and a pre-emphasis unit.

7. The ultrasound transducer head according to claim 5, wherein the transfer element whose transfer function has a ramp with a negative slope includes at least one of a low-pass filter of at least the first order, an integrator and a de-emphasis unit.

8. The ultrasound transducer head according to claim 5, wherein each of the two transfer elements of the amplifier device includes at least one controllable capacitive component.

9. The ultrasound transducer head according to claim 5, wherein one of the two transfer elements includes at least one amplifier connected with a negative feedback circuit containing at least one controllable capacitive component and the other transfer element has a controllable pin diode.

10. The ultrasound transducer head according to claim 1, wherein the at least one controllable capacitive component is a controllable capacitive diode.

11. The ultrasound transducer head according to claim 2, wherein the at least one controllable capacitive component is a controllable capacitive diode.

12. The ultrasound transducer head according to claim 3, wherein the at least one controllable capacitive component is a controllable capacitive diode.

13. The ultrasound transducer head according to claim 4, wherein the at least one controllable capacitive component is a controllable capacitive diode.

14. The ultrasound transducer head according to claim 1, wherein a plurality of transducer elements are used, the plurality of transducer elements being in a two-dimensional array, each of the plurality of transducer elements having its own amplifier device.

15. An ultrasound device for providing an image of an object, comprising:
    an ultrasound transducer head comprised of at least one transducer element for receiving ultrasound signals and converting said ultrasound signals into electrical signals and an amplifier device for electrically amplifying the electrical signals of the transducer element, the amplifier device including at least one controllable capacitive component for controlling the gain of the amplifier device; and
    a controller for controlling the capacitance of the at least one controllable capacitive component.

16. An ultrasound device according to claim 15, the device further comprising a signal processor for creating an image of the object from the electrical signals of the at least one transducer element after the electrical signals are amplified, the signal processor being connected to the output of the amplifier device by signal lines, wherein the output impedances of the amplifier device are approximately matched to the impedances of the signal lines.

* * * * *